United States Patent
Boje et al.

(10) Patent No.: US 12,334,728 B2
(45) Date of Patent: Jun. 17, 2025

(54) SENSOR AND A SENSOR NETWORK FOR MONITORING UTILITY POLES

(71) Applicant: University of Cape Town, Cape Town (ZA)

(72) Inventors: Edward Sidney Boje, Cape Town (ZA); Jason Andrew Hardy, Rondebosch (ZA)

(73) Assignee: University of Cape Town, Cape Town (ZA)

( * ) Notice: Subject to any disclaimer, the term of this patent is extended or adjusted under 35 U.S.C. 154(b) by 753 days.

(21) Appl. No.: 17/055,669

(22) PCT Filed: Jun. 5, 2019

(86) PCT No.: PCT/IB2019/054666
§ 371 (c)(1),
(2) Date: Nov. 16, 2020

(87) PCT Pub. No.: WO2019/234649
PCT Pub. Date: Dec. 12, 2019

(65) Prior Publication Data
US 2021/0190848 A1   Jun. 24, 2021

(30) Foreign Application Priority Data
Jun. 5, 2018  (GB) .................................... 1809227

(51) Int. Cl.
| | | |
|---|---|---|
| *H02J 13/00* | (2006.01) | |
| *G01P 13/00* | (2006.01) | |
| *G01P 15/00* | (2006.01) | |
| *G01R 15/20* | (2006.01) | |
| *G01R 19/00* | (2006.01) | |
| *G01R 31/08* | (2020.01) | |

(Continued)

(52) U.S. Cl.
CPC ........ *H02J 13/00022* (2020.01); *G01P 13/00* (2013.01); *G01P 15/00* (2013.01);
(Continued)

(58) Field of Classification Search
CPC ........... H02J 13/00022; H02J 13/00002; H02J 13/00006; G01P 13/00; G01P 15/00;
(Continued)

(56) References Cited

U.S. PATENT DOCUMENTS

| | | | | |
|---|---|---|---|---|
| 8,941,491 B2* | 1/2015 | Polk | ....................... | H04L 12/66 |
| | | | | 340/539.22 |
| 9,562,925 B2* | 2/2017 | Nulty | ....................... | H02J 3/00 |

(Continued)

FOREIGN PATENT DOCUMENTS

| | | |
|---|---|---|
| CN | 106404319 A | 2/2017 |
| GB | 2440555 A | 2/2008 |

(Continued)

OTHER PUBLICATIONS

Combined Search and Examination Report dated Dec. 5, 2018, issued by the United Kingdom Patent Office in connection with United Kingdom Application No. GB1809227.0 (7 pages).

(Continued)

*Primary Examiner* — Natalie Huls
(74) *Attorney, Agent, or Firm* — McCarter & English, LLP

(57) ABSTRACT

A sensor for monitoring utility poles includes a sensing module to detect a physical quantity from a utility pole or a conductor supported by a utility pole to which the sensor is attached in use. A power supply supplies power to the device and a memory for storing sensor data. A communications module is used for transmitting and receiving sensor data to and from one or more sensors which are attached to other utility poles located adjacent to or nearby the utility pole. A processor uses the detected sensor data together with received sensor data to calculate if the utility pole to which the sensor is attached has changed its physical condition, and wherein if the processor calculates that the utility pole to (Continued)

which the sensor is attached has changed its physical condition, a message is transmitted via the communications module to a remote server.

5 Claims, 5 Drawing Sheets

(52) U.S. Cl.
CPC ......... *G01R 15/20* (2013.01); *G01R 19/0092* (2013.01); *G01R 31/085* (2013.01); *H02J 13/00002* (2020.01); *H02J 13/00006* (2020.01)

(58) Field of Classification Search
CPC .. G01R 15/20; G01R 19/0092; G01R 31/085; Y04S 10/30; Y04S 40/126; Y04S 40/12; Y02E 60/00
See application file for complete search history.

(56) References Cited

U.S. PATENT DOCUMENTS

| | | | |
|---|---|---|---|
| 2014/0278150 A1* | 9/2014 | Baesler | E04H 12/00 702/34 |
| 2015/0355144 A1 | 12/2015 | Bartuli | |
| 2016/0313209 A1* | 10/2016 | Van Zee | G01M 5/0066 |
| 2017/0285091 A1* | 10/2017 | Jiang | H02J 3/381 |
| 2019/0227112 A1 | 7/2019 | Keshet | |

FOREIGN PATENT DOCUMENTS

| | | | | |
|---|---|---|---|---|
| GB | 2543114 A | | 4/2017 | |
| GB | 2548974 A | | 10/2017 | |
| JP | 2005249677 A | * | 9/2005 | ............. G01R 31/02 |
| JP | 2006217704 A | * | 8/2006 | ........... Y04S 40/126 |
| WO | 2010/046844 A2 | | 4/2010 | |
| WO | 2014/075140 A1 | | 5/2014 | |
| WO | 2017/149267 A1 | | 9/2017 | |

OTHER PUBLICATIONS

International Search Report of the International Searching Authority mailed on Sep. 23, 2019, issued in connection with International Application No. PCT/IB2019/054666 (3 pages).

Written Opinion of the International Searching Authority mailed on Sep. 23, 2019, issued in connection with International Application No. PCT/IB2019/054666 (6 pages).

* cited by examiner

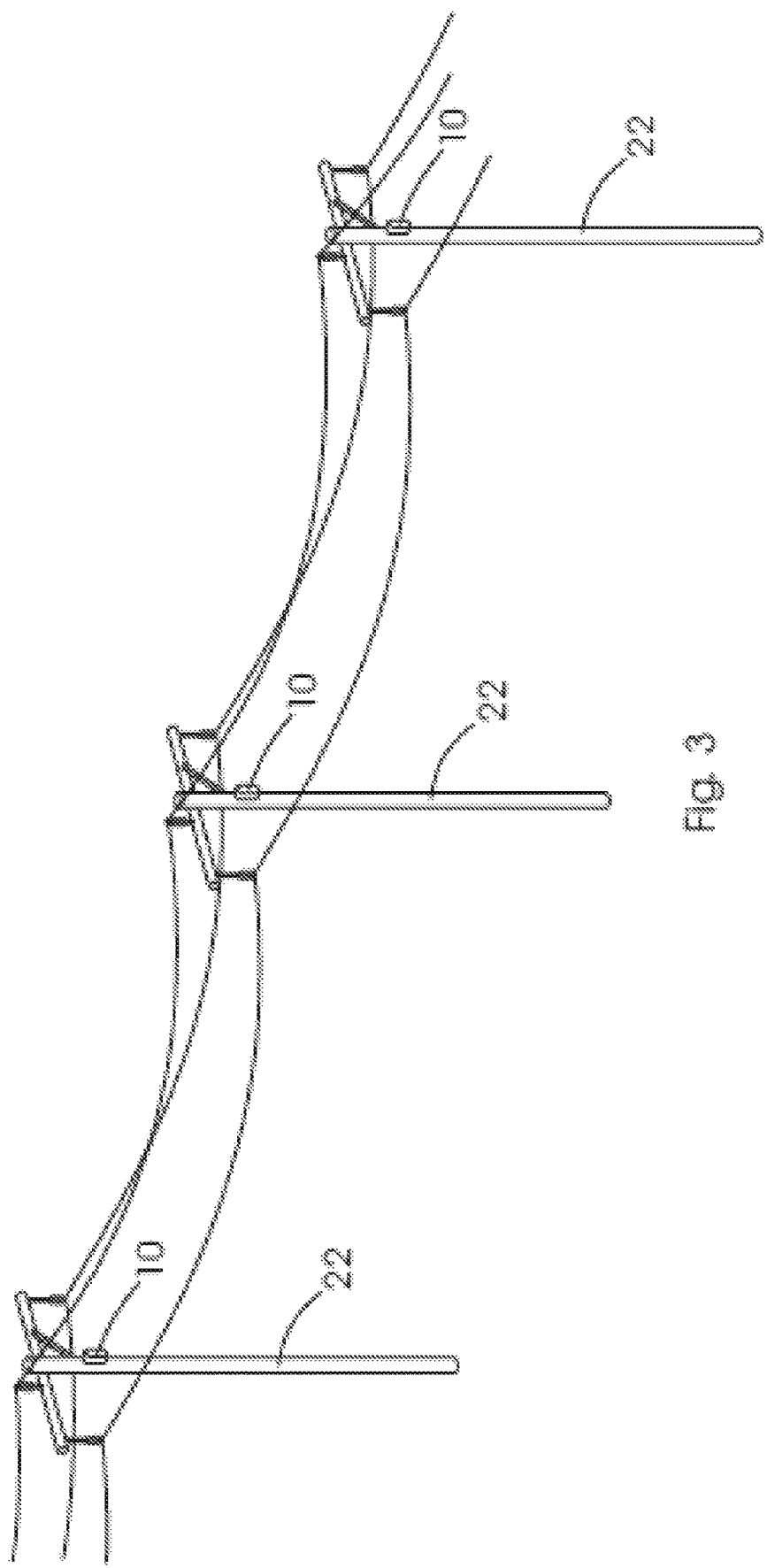

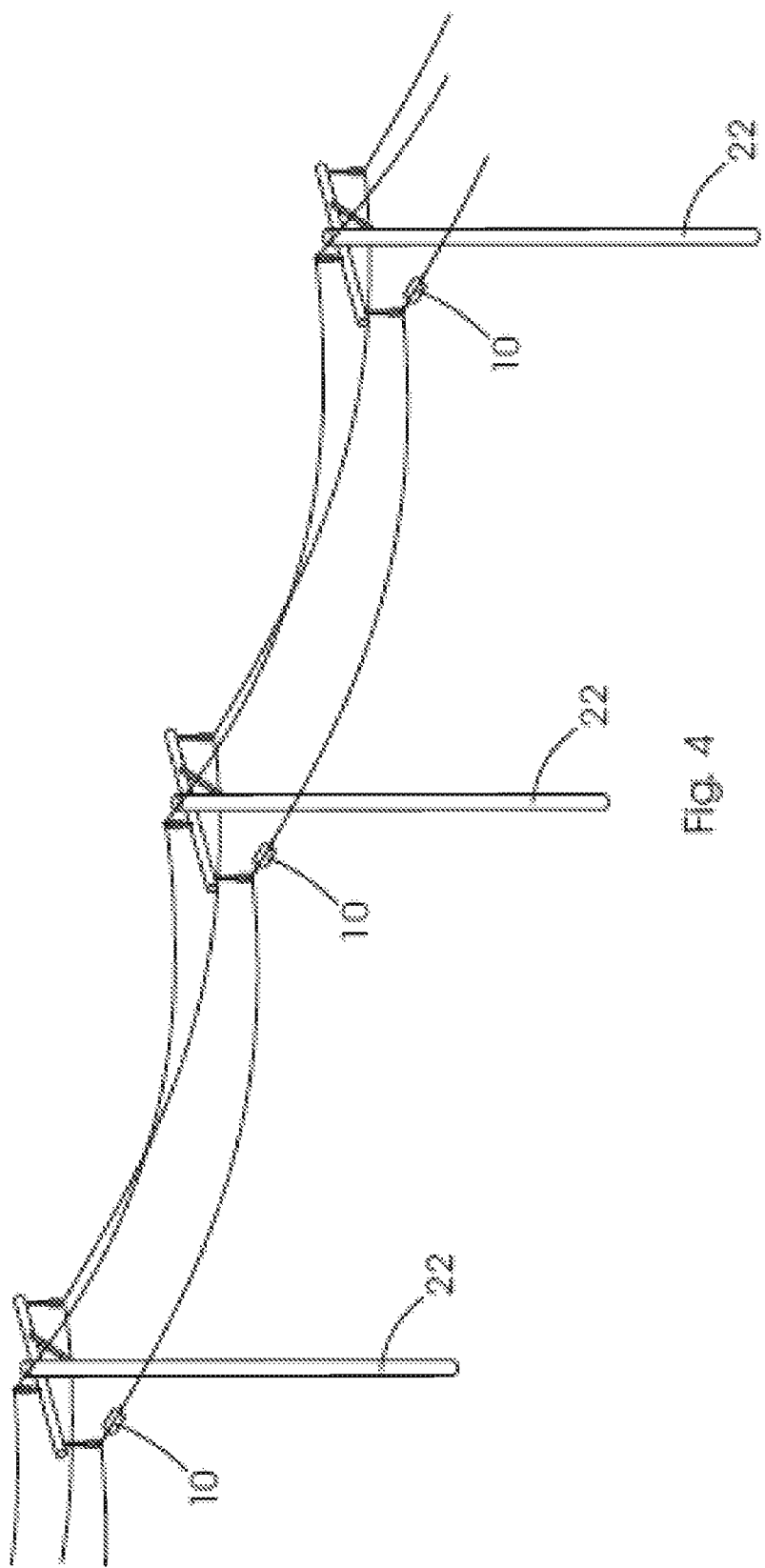

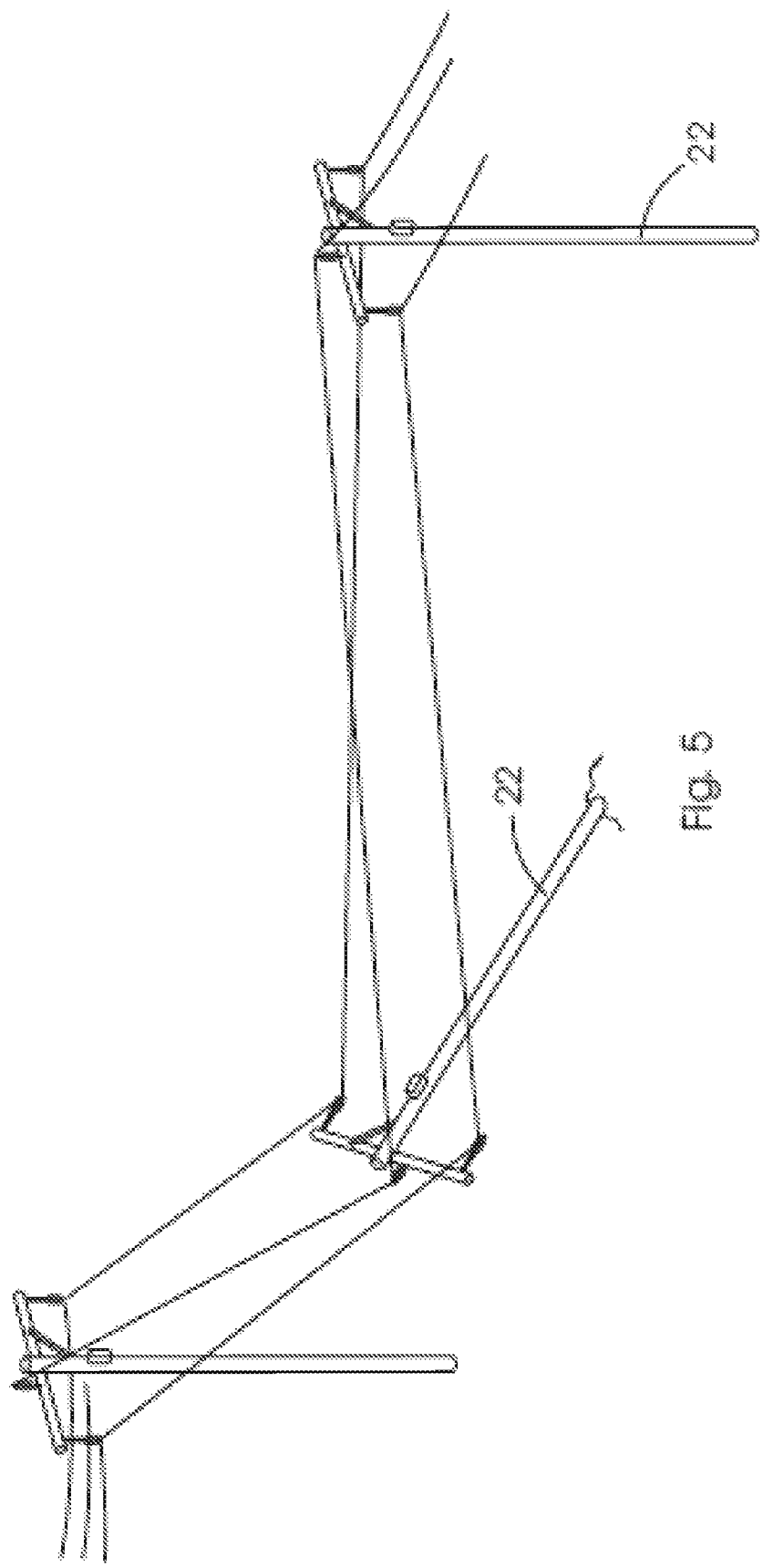

SENSOR AND A SENSOR NETWORK FOR MONITORING UTILITY POLES

RELATED APPLICATIONS

This application is a U.S. National Phase Application under 35 U.S.C. 371 of International Application No. PCT/IB2019/054666 filed Jun. 5, 2019, which claims the benefit of Great Britain Patent Application No. 1809227.0 filed on Jun. 5, 2018. The disclosures of these applications are incorporated herein by reference in their entireties.

BACKGROUND OF THE INVENTION

THIS invention relates to a sensor network for monitoring utility poles.

One example of the utility poles in question would be to monitor the supporting structures of distribution power lines.

Worldwide, there are many tens of millions of wood poles supporting distribution lines. For example, in the United States there are over 10 million km of distribution power lines, while Eskom in South Africa operates around 300 000 km of overhead distribution lines energized at 22 kV or lower. These lines are typically supported by wooden structures (poles) with a height of approximately 8 m, spaced approximately 200 m apart. This equates to over 1 million poles in South Africa.

Depending on the environment, the lifespan of wooden poles is around 40 years before they succumb to groundline decay, and fungal or insect attack. Moves to ban pesticide treatment of wood poles will tend to shorten field life. Early failure also occurs due to unpredictable weather or human activity (strong winds, lightning, fire, car accidents, etc.)

Apart from the threat to public safety, falling power lines cause financial loss to the utility as a result of damage to property, loss of sales and lost opportunity due to interrupted power delivery.

The risks and financial loss can be mitigated by appropriate maintenance and fast, accurate fault reporting.

Current methods of inspecting distribution lines and supporting structures are costly, labour intensive and constrained by legislation (helicopters, drones, walking the line).

The present invention seeks to address this.

SUMMARY OF THE INVENTION

In accordance with the invention there is provided a sensor for monitoring utility poles, the sensor comprising:
  a sensing module to detect a physical input from a utility pole or a conductor supported by a utility pole to which the sensor is attached;
  a power supply;
  a memory for storing sensor data and other data related to the operation of the sensor;
  a communications module for transmitting and receiving sensor data to and from one or more sensors which are attached to other utility poles or a conductor supported by the other utility poles, wherein the other utility poles are located adjacent to or nearby the utility pole; and
  a processor operably coupled to the sensing module, memory and communications module, the processor using the detected sensor data together with received sensor data to calculate if the utility pole to which the sensor is attached has changed its physical condition, and wherein if the processor calculates that the utility pole to which the sensor is attached has changed its physical condition, a message is transmitted via the communications module to a remote server.

The sensing module may be a motion sensor which detects movement of the utility pole in which case the motion sensor typically includes an accelerometer.

Alternatively or in addition, the sensing module may be a magnetic field sensor which detects the magnetic field resulting from the current in a conductor supported by the utility pole.

The communications module may be further adapted to transmit data to a remote server for historical records, for maintenance actions and to alert appropriate personnel.

BRIEF DESCRIPTION OF THE DRAWINGS

The invention will now be described, by way of example, with reference to the accompanying diagrammatic drawings.

In the drawings:
FIG. 3 shows an example of utility poles with a plurality of conductors supported by the utility poles and with a sensor attached to each pole;
FIG. 4 shows an example of utility poles with a plurality of conductors supported by the utility poles and with a sensor attached to the conductors;
and
  FIG. 5 shows an example of utility poles with one of the poles having fallen over which the system will be able to detect based on changes to the sensor measurements when compared to measurements of nearby sensors.

DESCRIPTION OF PREFERRED EMBODIMENTS

Figure 1:
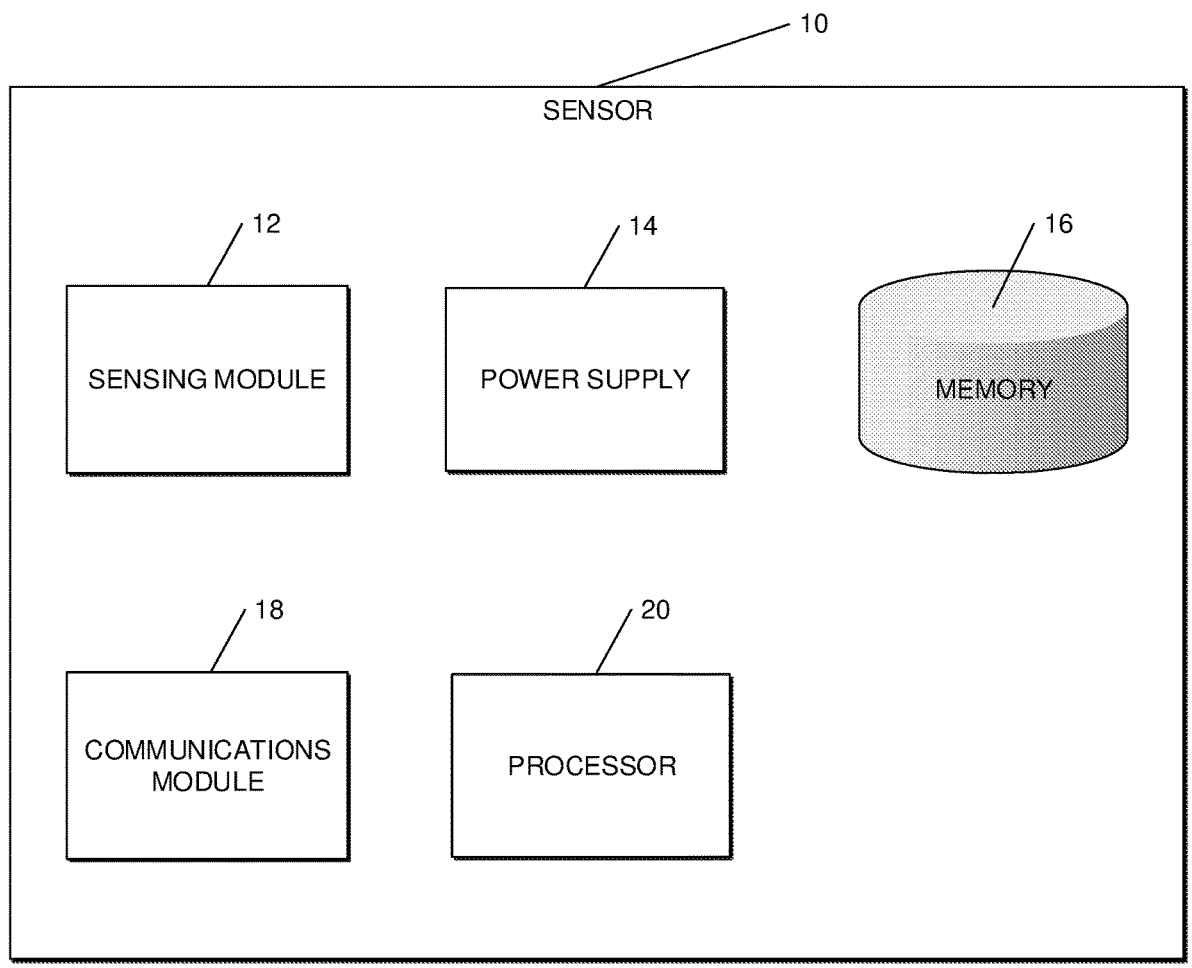
FIG. 1 shows a schematic diagram of a sensor.

The invention relates to a sensor and a sensor network for monitoring utility poles.

Referring to the accompanying Figures, a sensor 10 for monitoring utility poles is shown.

The sensor comprises a sensing module 12 to detect a physical input from a utility pole or a conductor supported by a utility pole to which the sensor is attached and/or to detect local environmental conditions. This will be described in more detail below.

The methodology described below could be applied to the sensing of a variety of physical inputs from the utility pole or the conductor supported by the utility pole.

Examples could be measuring the motion of the utility pole, the temperature of the utility pole or the surrounding area, the humidity of the utility pole or the surrounding area or measuring the magnetic field resulting from the current in a conductor supported by the utility pole to name a few examples.

Thus the sensing module may include sensors such as temperature, air pressure, smoke, and humidity to sense local conditions.

It will be appreciated that depending on the physical inputs the nature of the sensor itself will differ.

For example, if vibrations and/or inclination of the pole are being sensed an accelerometer will be used, whereas a magnetic field sensor will be used to sense the alternating magnetic field resulting from the current in the conductor or the direction of the Earth's local magnetic field for sensing orientation.

A power supply 14 supplies power to the other sensor components illustrated in the figure.

Special emphasis is placed on energy harvesting for the power supply. This could include for example using a solar cell or line current harvesting, storage (for example a super-capacitor for long field life of a rechargeable battery), low power operation and sufficient local processing power.

A memory 16 is used for storing sensor data and other data related to the operation of the sensor. Sufficient storage may be available on-board the processing module to make external storage unnecessary.

Communications module 18 is used for transmitting and receiving sensor data to and from one or more sensors which are attached to other utility poles or a conductor supported by the other utility poles. These other utility poles are located adjacent to or nearby the utility pole in question and this will also be described in more detail below.

The communications module 18 is further adapted to transmit data to a remote server for historical records, for maintenance actions and to alert appropriate personnel.

A processor 20 is operably coupled to the sensing module, memory and communications module.

The processor 20 uses the detected sensor data together with received sensor data to calculate if the utility pole to which the sensor is attached or associated has changed its physical condition, and wherein if the processor calculates that the utility pole to which the sensor is attached has changed its physical condition. This will also be described in more detail below.

On calculating that the utility pole to which the sensor is attached has changed its physical condition, a message is transmitted via the communications module 18 to a remote server (not shown).

The device 10 will do most processing locally on the device because of limited communication bandwidth. This limitation is because of limited power and in the end, limited channel bandwidth (e.g. if all data from all sensors needs to be transmitted to a central server), An example implementation will now be described with reference to measuring the vibration of a pole.

Assuming isotropic material for simplicity, vibration of a utility pole can be modelled via the Euler-Bernoulli equation (with no internal damping), $$\frac{\partial^2}{\partial x^2}\left(EI(x)\frac{\partial^2 w}{\partial x^2}\right) = -\rho A(x)\frac{\partial^2 w}{\partial t^2} + q(x,t)$$

$\rho$ is the density, $A(x)$ is the area,

E is the modulus of elasticity, $I(x)$ is the moment of inertia, for a uniform circular section, $$I = \frac{\pi}{64}D(x)^4$$

with D the diameter, $q(x,t)$ is the external force (in our case, wind and vortex forces as well as excitation from the lines and environment in general), and w is the displacement.

For a uniform cylindrical pole cantilevered at the ground interface, the natural frequencies are:

$$\omega_i = \beta_i^2 \sqrt{\frac{EI}{\mu}} \;[rad/s], \text{ with } \beta_i L/\pi = [0.59686, 1.49418, 2.50025 \ldots ]$$

Figure 2:
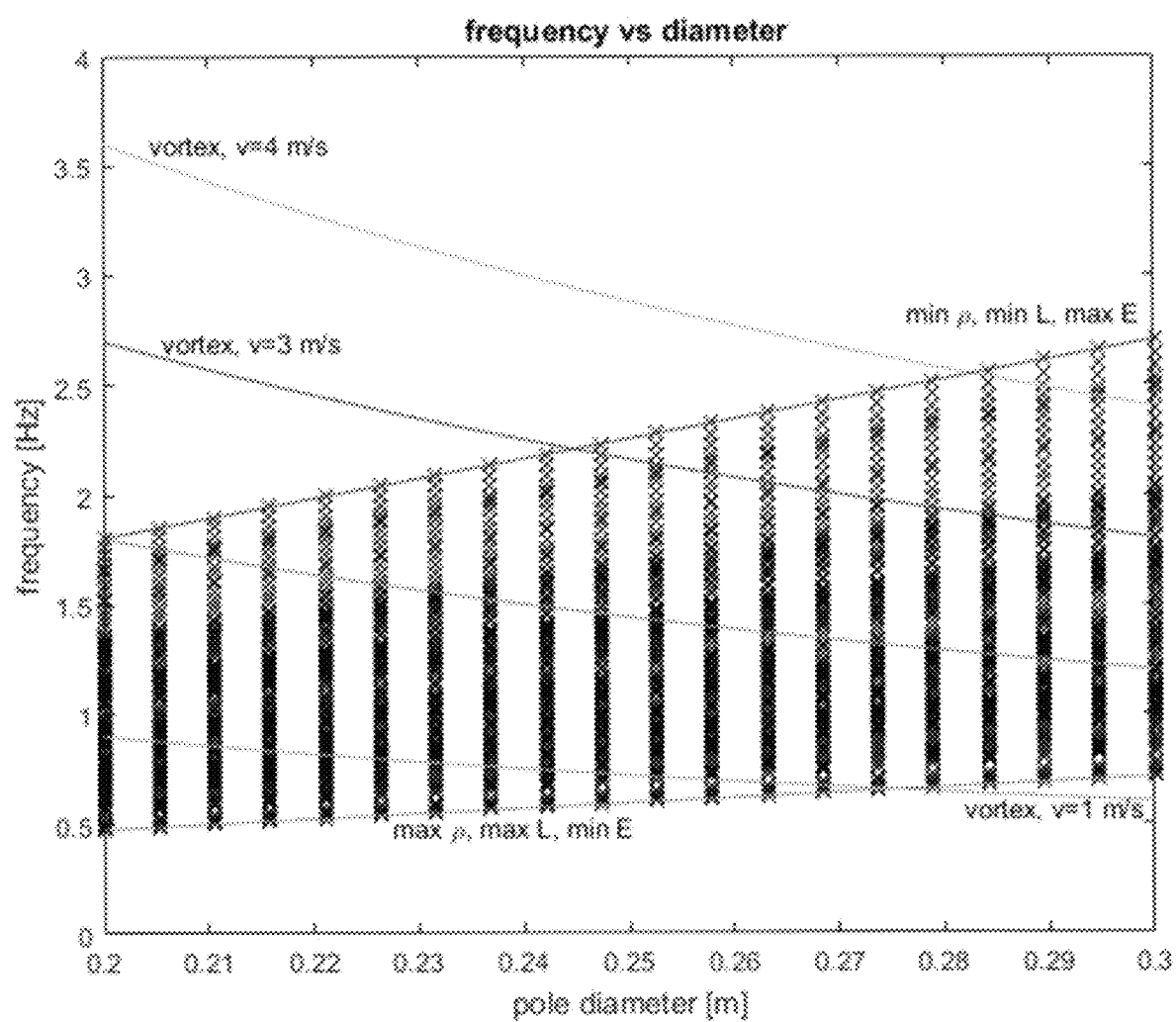
FIG. 2 is a graph showing (a) First resonant frequency as a function of diameter over range of elastic modulus (length and density), and (b) Vortex shedding frequency as a function of diameter over a range of wind velocities.

For the parameter range used in FIG. 2, the first resonant frequency is in the range, $f_1 \in [0.5, 2.7]$ Hz and the second resonant frequency is in the range $f_1 \in [2.9, 17.0]$ Hz. Similar results can be obtained for tapered poles.

For a cylindrical pole free at the ground interface, the natural frequencies are $$\omega_i = \beta_i^2 \sqrt{\frac{EI}{\mu}}, \; \beta_i L/\pi = [1.50562, 2.49975, 3.50001 \ldots ]$$

A pole's vibration and bending modes may be excited by wind either as a result of aerodynamic drag in the direction of the wind or by vortex shedding in the cross-wind direction.

Vortex shedding is modelled in its simplest form via the Strouhal equation, $$f = St\, v/D$$

f is the vortex shedding frequency [Hz]

v is the wind velocity

St is the Strouhal number (Reynold number dependent but ~0.18 for the problem at hand)

D is the diameter

Re=vD/v, v is the kinematic viscosity (for air at 20° C., $v \approx 15 \times 10^{-6}$ m$^2$/s and Re$\approx 10^5$ at 5 m/s).

The vortex shedding frequency and first mode overlap over typical diameters, $D \in [0.2, 0.3]$ m; pole lengths $L \in [10, 15]$ m; modulus of elasticity, $E \in [5, 12]$ GPa; and density, $\rho \in [290, 340]$ kg/m$^3$.

At wind speeds $v \in [1, 5]$ m/s, there is a chance of exciting either the first or the second mode and for wind speeds $v \in [5, 19]$ m/s the second mode can be excited. The surface roughness of a pole and its taper will tend to reduce the excitation effects. The vortex shedding effects will be in the cross-wind direction.

Vortex shedding from the conductors is at a higher frequency due to the smaller diameter of the conductors (in the range [10, 40] mm).

FIG. 2 shows (a) First resonant frequency as a function of diameter over range of elastic modulus (length and density), and (b) Vortex shedding frequency as a function of diameter over a range of wind velocities.

The effect of wind gusts is described as follows.

Variations in the wind speed will result in varying drag loading exciting the pole. This is expressed as a differential, $df_{drag} = \frac{1}{2}\rho c_d v^2 D\, dL$, where $c_d$ is the aerodynamic drag coefficient and dL is the differential length to account for the fact that the wind velocity will be distributed along the length of the pole due to ground effects, etc. The effects of wind gusts will be accelerations in the direction of the wind.

The average component of the wind acting on the pole and conductors supported by the pole will result in deflection of the pole which may be measured by processing accelerometer data at higher wind speeds.

Referring to FIG. 3, a typical setup is illustrated with a plurality of utility poles 22, each having a sensor 10 located thereon.

In this example, for measuring motion such as vibration, accelerometers are used as the sensors 10. These will have one or generally more sensing axes.

As the sensors 10 need to be low cost, the capability of cheap accelerometers needs to be considered. A typical device could be a LIS2DH12 accelerometer which has noise figure of 220 µg/√Hz. A 1 mm peak oscillation at 0.5 Hz will give an acceleration of around 10 mg which is readily detectable in high resolution mode.

Regarding the communications module 18, it should be noted that the distribution poles are typically 200 m apart and by nature have a clear line of sight from pole to pole.

LoRa technology has more than enough range but is more expensive than technologies such as Bluetooth 5 which advertises a range in free space of up to 400 m.

It will be appreciated that any appropriate communication technology may be used and modern Internet of Things communication protocols are an example.

In any event, the communications should preferably be able to skip over poles in case of sensor failures.

The sensor 10 will typically capture, using sensing module 12, two-axis horizontal acceleration data (x-y) when there is sufficient wind speed to excite measurable vibrations.

The signals will be stored in the memory 16 and processed locally by the processor 20 to extract features (such as the vibrational modes).

Data is transmitted between nearby sensors using communications module 18 so that relative behaviour features can be extracted.

In this way, the local and relative response of a pole is learned. If the currently measured behaviour changes away from the learned behaviour, this may indicate a change or deterioration in the pole's condition. This information can be relayed to the appropriate personnel or management to initiate investigative or corrective action.

In the illustrated embodiment, the processor 20 uses the detected sensor data together with received sensor data to calculate if the utility pole to which the sensor is attached has changed its physical condition.

In terms of the data processing to accomplish this, the technologies that will be deployed may include
  (a) Transform methods: Sensor data signals can be analysed using the Fast Fourier Transform to extract the resonant frequencies (and damping) of each pole's modes.
  (b) Time domain identification can be used to obtain system parameters for relative behaviour between nearby poles.
  (c) Non-linear methods can be used to analyse the wind velocity dependency on vortex shedding induced vibration.

In any event, it will be appreciated that the wind velocity couples in a non-linear way from pole to pole but the effect of the wind on a pole will remain constant unless the physical properties of the pole changes. The local wind conditions will depend on terrain, vegetation and buildings in the vicinity and the response of a pole to wind will depend on its physical properties, the pole footing, suspended conductors and supports such as guys and stays.

In case of using magnetic sensors, one example is to use a least squares parameter estimation scheme with alarms on rapid or large changes in the result.

It will be appreciated that changes in a pole's mechanical properties may be detected by a change in vibration signature and the condition information then relayed to the central server for appropriate further action.

The detection of changes in mechanical properties is enhanced by comparative analysis of motion behaviour from adjacent or nearby poles, as described above.

Referring now to FIGS. 3 to 5, an example of utility poles with a plurality of conductors supported by the utility poles and with a sensor attached to each pole or to the conductors attached to each pole is shown.

FIG. 5 shows an example of where one of the poles has fallen over which the system will be able to detect based on changes to the sensor measurements when compared to measurements of nearby sensors.

In the methods described above it will be appreciated that excitation from the environment is used to make the measurements.

As very low power is used, the sensor 10 will measure and transmit as the state of charge of the electronics and environmental conditions allow. Thus the state of charge is used in deciding what algorithmic work can be done at a particular time, keeping a reserve for network-wide communications and to report in emergencies.

It will be appreciated that the wind velocity is linearly related to the excitation frequency if there is vortex shedding and this means that for any specific pair of poles exposed to the same wind conditions, the expected ratio of excitation frequencies will remain constant (in the ratio of their diameters). If the resonant frequency changes due to deterioration of a pole's ground attachment, the changed response will be visible.

The response to wind gusts is common except for spatial variation and delay. This allows relative responses between neighbouring poles to be used in place of explicit measurements of the wind condition.

Results may be improved by utilizing wind speed vector estimates from low cost hardware.

The end application may use an artificial intelligence application to extract more information than just the relative wind velocity.

Wind velocity estimates and local temperature measurements may be relayed to the central server in order to enable dynamic line load limit adjustments (for example, high winds and low temperatures will allow line load limit to be increased).

The use of comparative data between poles has not been used up until now, not only because the technology has not been cheap enough to consider this, but in addition because the vortex shedding and wind gust effects are diameter dependent and are therefore not the same for all poles.

Excitation from vibration in the conductors between adjacent poles is shared and the invention uses shared information to detect changes in relative behaviour.

Excitation from wind gusts is shared amongst nearby poles because the excitation source is similar within the spatial dimensions of the transmission line.

It will be appreciated that the invention uses shared information to detect changes in relative behaviour.

In one example, the sensor may incorporate magnetic field sensing (for line current, line geometry and attitude sensing), accelerometers (for attitude and vibration sensing), pressure sensor (for altitude and weather sensing), temperature (environment and fire detection) and so forth.

The invention claimed is:

1. A sensor for monitoring a utility pole, the sensor including:
  a sensing module to detect a physical quantity from a utility pole or a conductor supported by a utility pole to which the sensor is attached in use;
  a power supply in the sensor;

a memory in the sensor for storing data from the sensing module and other data related to the operation of the sensor;

a communications module in the sensor for transmitting and receiving sensor data to and from a second remote sensor attached to a second remote utility pole or a conductor supported by a second remote utility pole, wherein a second remote utility pole is located adjacent to or nearby a utility pole to which the sensor is attached; and a processor in the sensor operably coupled to the sensing module, memory and communications module, the processor using the detected data together with received sensor data from the second remote sensor at a second remote utility pole to calculate if a utility pole to which the sensor is attached has changed its physical condition, and wherein if the processor calculates that a utility pole to which the sensor is attached has changed its physical condition, a message is transmitted via the communications module to a remote server.

2. A sensor according to claim 1 wherein the sensing module comprises a motion sensor which detects movement of a utility pole.

3. A sensor according to claim 2 wherein the motion sensor includes an accelerometer.

4. A sensor according to claim 1 wherein the sensing module comprises a magnetic field sensor which detects a magnetic field resulting from electrical current in one or more conductors supported by a utility pole.

5. A sensor according to claim 1 wherein the communications module is further adapted to transmit data to a remote server for historical records, for maintenance actions and to provide alerts to appropriate personnel.

* * * * *